United States Patent
Dagdag et al.

(10) Patent No.: US 9,287,223 B2
(45) Date of Patent: Mar. 15, 2016

(54) DEVICE FOR ELECTRIC INSULATION OF A CONDUCTING PLANE

(75) Inventors: Selim Dagdag, Tarbes (FR); Michikazu Nagata, Kagoshima (JP); Bertrand Chauchat, Salles Adour (FR); Sebastien Nicolau, Loubajac (FR); Toshiyuki Hamachi, Kagoshima (JP)

(73) Assignee: Alstom Transport SA, Levallois-Perret (FR)

( * ) Notice: Subject to any disclaimer, the term of this patent is extended or adjusted under 35 U.S.C. 154(b) by 732 days.

(21) Appl. No.: 13/473,846

(22) Filed: May 17, 2012

(65) Prior Publication Data

US 2013/0044441 A1    Feb. 21, 2013

(30) Foreign Application Priority Data

May 17, 2011   (FR) ...................................... 11 54282

(51) Int. Cl.
| | |
|---|---|
| H01L 23/62 | (2006.01) |
| H01L 23/373 | (2006.01) |
| H01L 23/498 | (2006.01) |
| H01L 23/13 | (2006.01) |

(52) U.S. Cl.
CPC ............... *H01L 23/62* (2013.01); *H01L 23/13* (2013.01); *H01L 23/3735* (2013.01); *H01L 23/49822* (2013.01); *H01L 2924/0002* (2013.01)

(58) Field of Classification Search
CPC ..................... H01L 23/3735; H01L 23/49822; H01L 23/62; H01L 23/13; H01L 2924/0002; H01L 2924/00
See application file for complete search history.

(56) References Cited

U.S. PATENT DOCUMENTS

| | | | | |
|---|---|---|---|---|
| 2,718,620 | A  * | 9/1955 | Howe ............................. | 324/666 |
| 6,211,554 | B1 * | 4/2001 | Whitney ........................ | 257/355 |
| 6,310,401 | B1 * | 10/2001 | Stoisiek et al. ................ | 257/782 |
| 6,351,011 | B1 * | 2/2002 | Whitney et al. ................ | 257/355 |
| 6,597,063 | B1 * | 7/2003 | Shimizu et al. ................ | 257/687 |
| 6,613,450 | B2 * | 9/2003 | Tsukaguchi et al. .......... | 428/621 |
| 2001/0011766 | A1 * | 8/2001 | Nishizawa et al. ............ | 257/685 |
| 2002/0048153 | A1 * | 4/2002 | Seshan .......................... | 361/704 |
| 2002/0066953 | A1 * | 6/2002 | Ishiwata et al. ............... | 257/700 |
| 2002/0175782 | A1 * | 11/2002 | Trinh et al. .................... | 333/182 |
| 2009/0039498 | A1 * | 2/2009 | Bayerer ......................... | 257/700 |

(Continued)

FOREIGN PATENT DOCUMENTS

| | | |
|---|---|---|
| DE | 102008026347 A1 | 2/2010 |
| EP | 1818980 A2 | 8/2007 |
| WO | 2011040054 A1 | 4/2011 |

*Primary Examiner* — David M Sinclair
*Assistant Examiner* — Theron Milliser
(74) *Attorney, Agent, or Firm* — Davidson, Davidson & Kappel, LLC (57) ABSTRACT

A device for insulating an electrically conducting plane having a first electric potential relatively to a second electric potential is provided. The device comprises an insulating substrate including two parallel planar surfaces, a first conducting outer layer and an electrostatic field reducer. The electrostatic field reducer reduces the value of the electrostatic field in a point of the peripheral edge, the reducer includes at least one conducting area distinct from the first outer layer, positioned on the first surface of the insulating substrate and/or in the insulating substrate. The reducer reduces the value of the electrostatic field in this point relative to the value of the electrostatic field in this point in the absence of the conducting area. The conducting area has a potential with a value strictly comprised between the values of the first and second potentials.

11 Claims, 4 Drawing Sheets

(56) References Cited

U.S. PATENT DOCUMENTS

2010/0065962 A1* 3/2010 Bayerer et al. ............... 257/703
2012/0127684 A1 5/2012 Matsumoto et al.
2013/0341781 A1* 12/2013 Imai et al. .................... 257/693

* cited by examiner

DEVICE FOR ELECTRIC INSULATION OF A CONDUCTING PLANE

Priority is hereby claimed to FR Patent Application No. 11 54282 filed on May 17, 2011, the entire disclosure of which is hereby incorporated by reference herein.

The present invention relates to a device for electric insulation of an electrically conducting plane capable of having a first electric potential relatively to a second electric potential.

BACKGROUND

An electric insulation device of the aforementioned type is known. The electric insulation device comprises an insulating substrate including two planar surfaces parallel to each other, and two substantially planar electrically conducting layers, each being positioned on a corresponding planar surface of the insulating substrate. Each conducting layer has a peripheral edge, and the peripheral edge of the second layer is substantially identical with the equivalent of the peripheral edge of the first layer, translated along a direction normal to the plane of the first layer. The first layer is at the first potential, and the second layer is at the second electric potential. The insulating substrate is in aluminum nitride (AlN), in aluminum oxide ($Al_2O_3$), or further in silicon nitride ($Si_3N_4$).

Such an electric insulation device has relatively low dielectric rigidity, for example of the order of 15 kV/mm for a thickness of one millimeter, and may undergo deterioration for a voltage, called a breakdown voltage, with a relatively low value, of the order of 15 kV for a thickness of one millimeter in the aforementioned example. The thickness of the insulating substrate between both planar surfaces should then be increased in order to obtain a larger breakdown voltage, so that the insulation device is not deteriorated when a high potential difference is applied. The substrate of such a device consequently has a thickness of about 10 mm so as not to be deteriorated with regard to a potential difference of about 45 kV between both outer conducting layers.

SUMMARY OF THE INVENTION

However, the increase in the thickness of the insulating substrate in order to have a higher breakdown voltage causes an increase in the heat resistance of the substrate, which generates less cooling of the electronic components attached on the first conducting layer, and therefore an increase of their temperature.

An object of the present invention provides an electric insulation device having a higher breakdown voltage while retaining a same substrate thickness, in order not to increase the heat resistance of the substrate.

The present invention provides a device for electric insulation of an electrically conducting plane capable of having a first electrical potential relatively to a second electric potential, the device including an insulating substrate including two planar surfaces parallel to each other, a first electrically conducting, substantially planar, outer layer positioned on a first planar surface of the insulating substrate, the first outer layer forming the electrically conducting plane able to be connected to the first potential and having a peripheral edge, the second surface being able to be connected to the second electric potential. The device further includes an electrostatic field reducer for reducing the value of the electrostatic field in a point of the peripheral edge of the outer layer, the reducer including at least one electrically conducting area distinct from the first outer layer, positioned on the first planar surface of the insulating substrate and/or in the insulating substrate, the reducing means being capable of reducing the value of the electrostatic field in this point relatively to the value of the electrostatic field in this point in the absence of the conducting area, the conducting area being capable of having an electric potential with a value strictly comprised between the values of the first and second electric potentials.

According to other preferred embodiments, the electric insulation device may include one or more of the following features, taken individually or according to all technically possible combinations:

- the first outer layer forms a track for circulation of an electric current and is the single track for circulating an electric current of the device;
- the device further comprises a second electrically conducting, substantially planar outer layer, positioned on the second planar surface of the insulating substrate, said or each conducting area being distinct from the first and second outer layers and positioned on the first planar surface of the insulating substrate and/or on the second planar surface of the insulating substrate and/or in the insulating substrate;
- the reducer includes N conducting areas, N being greater than or equal to 2, each conducting area being capable of having a distinct electric potential with a value strictly comprised between the values of the first and second electric potentials, the values of the electric potentials of the conducting areas decreasing from the edge of the first outer layer towards the outside of the device and/or towards the second outer layer;
- the conducting area includes an electrically conducting intermediate layer positioned in the insulating substrate parallel to the first outer layer, the intermediate layer extending at least up to the equivalent in the plane of the intermediate layer, of the peripheral edge of the first outer layer, translated along a direction normal to the plane of the first outer layer;
- each conducting area includes an electrically conducting intermediate layer positioned in the insulating substrate parallel to the first outer layer, and a guard ring positioned in the plane of each conducting layer except for a central intermediate layer, the guard ring surrounding the corresponding conducting layer, the spacing between the peripheral edge of the corresponding conducting layer and the guard ring being equal to a predetermined distance, each guard ring being electrically connected to an intermediate layer having a potential different from that of the conducting layer around which it is laid out;
- the conducting area includes a guard ring positioned in the plane of said or each outer conducting layer and surrounding said or each outer conducting layer, and means for setting the value of the electric potential of the guard ring to a value strictly comprised between the values of the first and second electric potentials, the spacing between the respective peripheral edge of the outer layer and respective guard ring being equal to a predetermined distance;
- the P guard rings concentrically surround said or each outer layer and are positioned in the plane of said or each outer layer, P being greater than or equal to 2, the P guard rings being spaced apart from each other and from the peripheral edge of the corresponding outer layer;
- the attachment means include, for each guard ring, an electrically conducting intermediate layer positioned in the insulating substrate parallel to the first outer layer, and an electric connection between the respective guard ring and the respective intermediate layer;

the attachment means include for each guard ring, an electrical connection resistance with the neighboring guard ring of greater electric potential or else with the corresponding outer layer; and the device comprises a border covering the peripheral edge of said or each outer layer, the covering border being electrically insulating.

The present invention also provides an electric power supply system for electronic components, the system comprising a power supply source delivering an electric voltage to a conducting plane, the conducting plane having a first electric potential and being able to be connected to electronic components, and a device for electric insulation of the conducting plane relatively to a second electric potential. The insulation device is such as defined above, the first outer layer having the first electric potential and forming the conducting plane, and the second surface being connected to the second electric potential.

The present invention further provides the use of an electrically conducting area distinct from a first electrically conducting outer layer of a device for electric insulation of an electrically conducting plane which may have a first electric potential relatively to a second electric potential, in order to reduce the value of the electrostatic field in a point of the peripheral edge of the first outer layer relatively to the value of the electrostatic field in this point in the absence of the conducting area, the device comprising an insulating substrate including two planar surfaces parallel to each other, the first substantially planar outer layer is positioned on a first planar surface of the insulating substrate, the first outer layer forming the electrically conducting plane which may be connected to the first potential and having a peripheral edge, and the second surface being able to be connected to the second electric potential, the conducting area being positioned on the first planar surface of the insulating substrate and/or in the insulating substrate, and the conducting area being able to have an electric potential with a value strictly comprised between the values of the first and second electric potentials.

BRIEF DESCRIPTION OF THE DRAWINGS

These features and advantages of the invention will become apparent on reading the description which follows, only given as an example and made with reference to the appended drawings, wherein.

DETAILED DESCRIPTION

Figure 1:
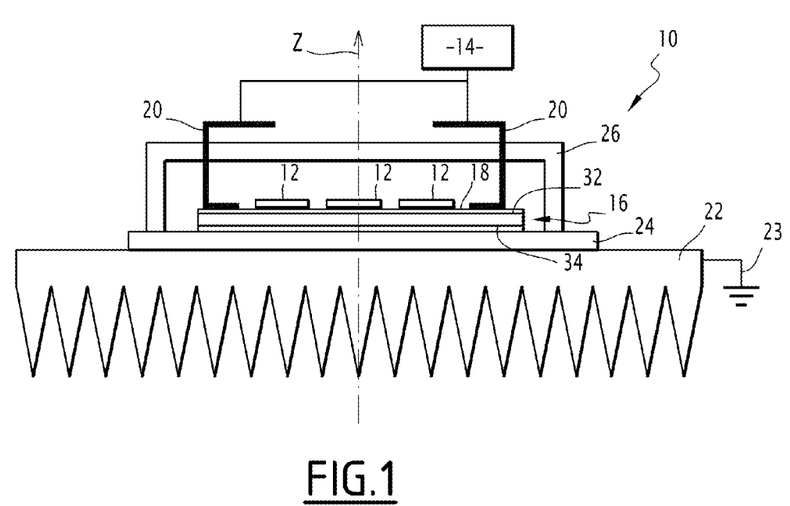
FIG. 1 is a schematic illustration of an electric power system for electronic components, the system comprising an electric insulation device according to the invention.

In FIG. 1, an electric power supply system 10 for electronic components 12 comprises an electric power source 14, an electric insulation device 16 including a conducting plane 18 for electric connection of the electronic components 12, and terminals 20 for electric connection of the conducting plane to the power supply source.

The electric power supply system 10 comprises a radiator 22 for dissipating heat energy released by the electronic components, the radiator 22 being connected to an electric ground 23, and to a sole 24 for attaching the electric insulation device to the radiator. The electric power supply system 10 comprises a casing 26 for protecting the electronic components and an insulation device, the protective casing 26 being attached to the sole 24.

The electronic components 12 are for example power transistors, each including a lower face, an upper face and a lateral face. Each transistor has on its lower face, a collector electrode and on its upper face, the gate and emitter electrodes. In the exemplary embodiment of FIG. 1, the transistors 12 are connected in parallel, the collector electrodes being electrically connected to the conducting plane 18. The electric connections with the gate electrodes for controlling the transistors and the emitter electrodes for the output of the current, laid out on the upper face of the transistors, are not illustrated in FIG. 1. The electronic components 12 are for example components capable of allowing circulation of an electric current having a voltage of 3.3 kV, or further 6.6 kV.

The power supply source 14 is a high voltage electric power supply source capable of delivering an electric voltage of the order of 25 kV, corresponding to a first electric potential V1.

The electric insulation device 16 insulates the conducting plane 18 capable of having the first electric potential V1 relatively to a second electric potential V2. The electric insulation device 16 comprises an insulating substrate 30 including a stack of insulating strata 31, a first planar surface 32 and a second planar surface 34, the planar surfaces 32, 34 being parallel to each other. The second surface 34 is connected to the second electric potential V2, such as for example the zero potential of the electrical ground 23.

A vertical axis Z perpendicular to the first planar surface 32 is illustrated in FIG. 1.

Figure 2:
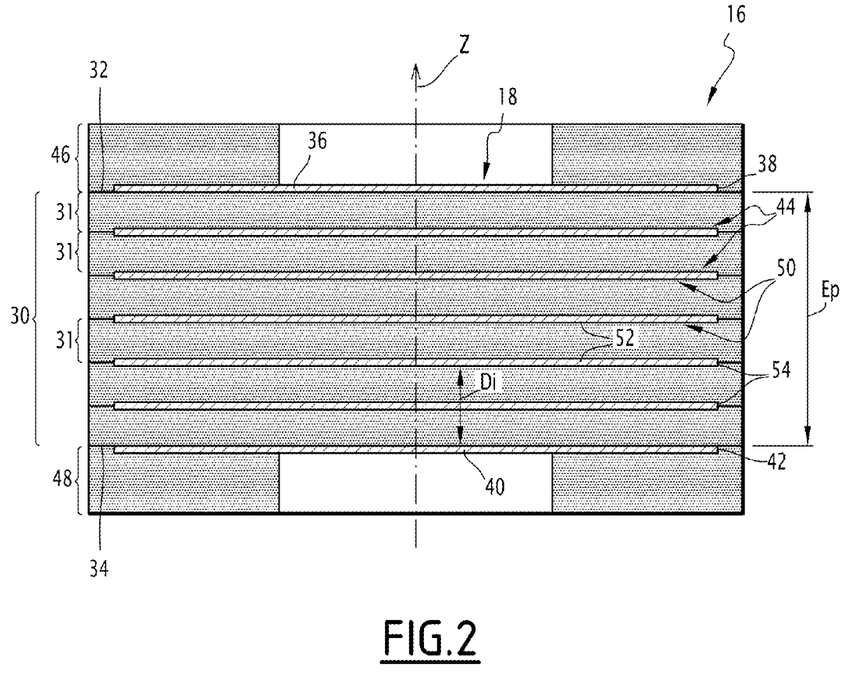
FIG. 2 is a schematic illustration, in a section along a vertical plane, of the insulation device of FIG. 1 according to a first embodiment of the invention.

The electric insulation device 16, illustrated in FIG. 2, in a section along a vertical plane passing through the vertical axis Z, further comprises a first outer electrically conducting, substantially planar layer 36 positioned on the first surface 32 of the insulating substrate, the first outer layer 36 having a peripheral edge 38 along a radial direction with respect to the vertical axis Z.

In addition, the electric insulation device 16 comprises a second outer, electrically conducting, substantially planar layer 40 positioned on the second surface 34 of the insulating substrate, the second outer layer 40 having a peripheral edge 42 along a radial direction with respect to the vertical axis Z.

The electric insulation device 16 also comprises an electrostatic field reducer 44 for reducing the value of the electrostatic field in a point of the peripheral edge 38, 42 of the outer layer 36, 40.

In addition, the electric insulation device 16 comprises a first border 46 for covering the peripheral edge 38 of the first outer layer, and a second border 48 for covering the peripheral edge 42 of the second outer layer, the covering borders 46, 48 being electrically insulating.

The insulating substrate 30 is for example made in aluminum nitride (AlN), or in aluminum oxide ($Al_2O_3$), or in silicon nitride ($Si_3N_4$), or further in single-crystal alumina also called sapphire. The insulating substrate 30 is preferably in aluminum nitride. The insulating substrate 30 for example has a thickness Ep substantially equal to 3.5 mm.

The first outer layer 36 forms the electrically conducting plane 18 connected to the first potential V1 corresponding to the power supply source 14. The first outer layer 36 forms a track for circulation of an electric current, such as the electric current delivered by the power supply source 14, and is the only track for circulation of current of the device 16.

The first outer layer 36 is for example, a solid layer, i.e. a layer entirely occupying the area interiorly delimited relatively to the peripheral edge 38. The peripheral edge 38 of the first layer is in the shape of a closed line, for example as a circle or a polygon. The peripheral edge 38 is preferably symmetrical with respect to the middle vertical axis Z. In the exemplary embodiment of FIG. 2, the peripheral edge 38 is in the form of a square with rounded angles.

The second outer layer 40 is substantially planar and is for example a solid layer. The peripheral edge 42 of the second outer layer is for example of a shape identical with the shape of the peripheral edge 38 of the first outer layer. More specifically, the peripheral edge 42 of the second layer is in the exemplary embodiment of FIG. 2, identical with the equivalent of the peripheral edge 38 of the first layer, translated along the vertical direction Z perpendicular to the plane of the first outer layer 36.

Alternatively, the peripheral edge 42 of the second layer is distinct from the translated equivalent of the peripheral edge 38. In other words, the peripheral edge 42 is shifted from the peripheral edge 38 radially towards the outside of the device with respect to the axis Z, or else shifted from the peripheral edge 38 radially towards the inside of the device with respect to the axis Z.

The first and second layers 36, 40 are obtained by metallization of the insulating substrate 30, and have a thickness of a few micrometers.

The first and second layers 36, 40 are for example made in tungsten or in molybdenum.

Figure 3:
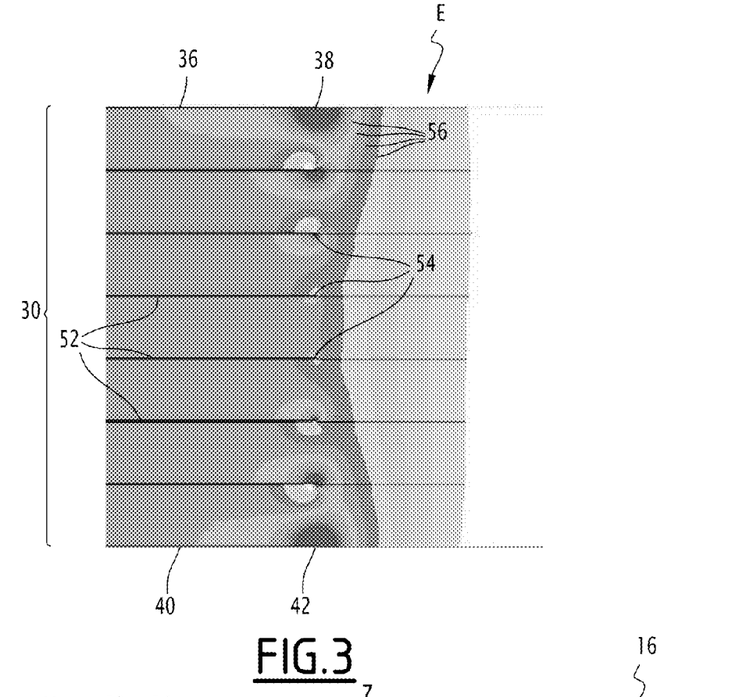
FIG. 3 is an illustration of the electrostatic field lines in the vicinity of an edge of conducting layers of the insulation device of FIG. 2.

The reducer 44 includes at least one electrically conducting area 50 distinct from the outer layers 36, 40 and positioned on the first planar surface 32 of the insulating substrate and/or in the insulating substrate 30. The reducer 44 is able to reduce the value of the electrostatic field E, visible in FIG. 3 illustrating the lines of the electrostatic field E, in a point of the peripheral edge 38, 42 relatively to the value of the electrostatic field in this point in the absence of any conducting area distinct from the outer layers. The conducting area 50 is able to have an electric potential Vi with a value strictly comprised between the values of the first and second electric potentials V1, V2.

In the exemplary embodiment of FIG. 2, the reducer 44 includes five conducting areas 50 and each conducting area 50 is in the form of an electrically conducting intermediate layer 52 positioned in the insulating substrate 30 parallel to the first outer layer 36. Each intermediate layer 52 extends at least up to the equivalent in the plane of the intermediate layer 52, of the peripheral edge 38 of the first outer layer, translated along the axis Z normal to the plane of the first outer layer 36.

Each intermediate layer 52 has for example a peripheral edge 54 substantially identical with the equivalent of the peripheral edge 38 of the first outer layer 36, translated along the direction of the axis Z perpendicular to the plane of the first outer layer 36.

The intermediate layers 52 are obtained by successive metallizations of the different insulating strata 31 forming the insulating substrate. Each intermediate layer 52 is for example made in tungsten or in molybdenum.

Thus, when the power supply source 14 applies an electric voltage to the conducting plane 18 via the connection terminals 20, the first outer layer 36 has the first electric potential V1. The second outer layer 40 has the second electric potential V2, of zero value in the exemplary embodiment of FIGS. 1 to 3 wherein the second outer layer 40 is electrically connected to the sole 24, itself electrically connected to the electric ground 23.

The vector representing the electrostatic field E in a point of the substrate satisfies the following equation:

$$\vec{E} = -\overrightarrow{\text{grad}}(V) \quad (1)$$

wherein V represents the electric potential at said point of the substrate.

In FIG. 3 illustrating the lines 56 of the electrostatic field E, the dark areas in the vicinity of the peripheral edges 38, 42, 54 represent areas where the electrostatic field E is of a higher value, while the brighter areas correspond to the areas where the electrostatic field is lower.

In the vicinity of the middle vertical axis Z, the value of the electric potential Vi of a point in the insulating substrate is a value comprised between the potentials V1 and V2, more specifically a linear function of the distance between said point and the outer layers 36, 40. The value of the potential Vi in the vicinity of the Z axis then satisfies the following equation:

$$Vi = V2 + \frac{(V1 - V2) \times Di}{Ep} \quad (2)$$

wherein Di represents the distance between the point where the potential is determined and the second outer layer 40, and Ep represents the thickness of the insulating substrate 30, i.e. the distance separating the first and second outer layers 36, 40.

Each intermediate layer 52 then has the electric potential Vi obtained by means of equation (2) as a function of the spacing Di between the respective intermediate layer 52 and the second outer layer 40.

The value of the electric potential in a point of each peripheral edge 54 of an intermediate layer is then equal to the value of the electric potential for this intermediate layer 52 in the vicinity of the middle axis Z, determined by means of equation (2). In other words, the value of the electric potential is imposed in the plane of the intermediate layer 52 from the middle axis Z up to the peripheral edge 54, while in the electric insulation device of the state of the art, the potential line is substantially parallel to the outer conducting layers in the vicinity of the middle axis, and, while moving away from the axis Z, then tends to move closer to the peripheral edge 38, 42 of the closest outer layer 36, 40.

With each electrically conducting area 50, it is possible to avoid that the potential lines move too rapidly closer to the peripheral edge 38, 42 of the corresponding outer layer, by imposing the electric potential up to its peripheral edge 54. In other words, each conducting area 50 according to the invention gives the possibility of spacing apart the potential lines as compared with the potential lines of the electrical installation device of the state of the art only including the first and second outer layers, in the absence of any additional conducting area.

Each conducting area 50 according to equation (1) thus allows reduction in the value of the electrostatic field E at the peripheral edges 38, 42 of the first and second outer layers 36, 40.

Thus, with the electrical insulation device according to the invention, the electric voltage causing deterioration of the first outer layer 36, also called a breakdown voltage, is, for a same substrate thickness, of a larger value than the value of the breakdown voltage of the electric insulation device of the state of the art.

Indeed, the deterioration of the first outer layer 36 occurs when the value of the electrostatic field is greater than the dielectric rigidity of the material of the insulating substrate 30. Now, the value of the electrostatic field in the vicinity of the peripheral edge 38 of the first layer is, for a same thickness of the insulating substrate 30 and for the same values of the first and second potentials V1, and V2, lower with the insulation device according to the invention than with the insulation device of the state of the art according to the foregoing. In other words, the electric insulation device according to the invention supports a larger potential difference between its first outer layer and its second planar surface without generating any dielectric failure, also called breakdown of the insulation device.

Thus, it is conceivable that the electric insulation device according to the invention has a larger breakdown voltage while retaining a same substrate thickness, in order not to increase the heat resistance of the substrate.

Figure 4:
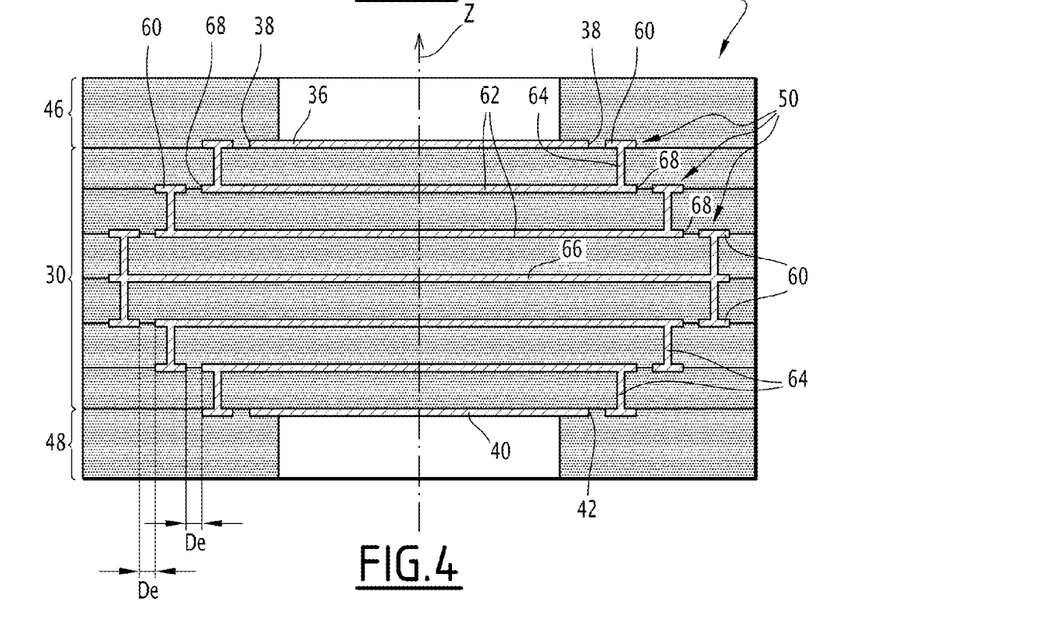
FIG. 4 is a view like the one of FIG. 2 according to a second embodiment of the invention.
Figure 5:
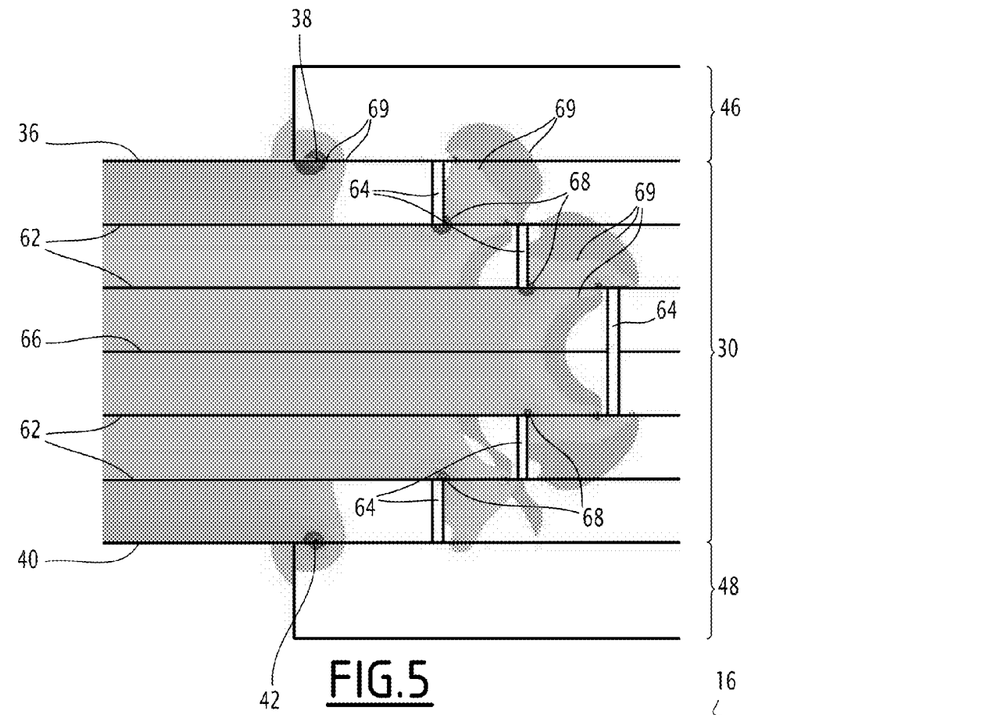
FIG. 5 is a view like the one of FIG. 3 according to the second embodiment of the invention.

FIGS. 4 and 5 illustrate a second embodiment of the invention for which the elements like those in the first embodiment described earlier are marked with identical references and are therefore not described again.

According to the second embodiment, each conducting area 50 includes a guard ring 60 and an electrically conducting intermediate layer 62 positioned in the insulating substrate 30 parallel to the first outer layer 36. Each conducting area 50 also includes a link 64 for connecting the guard ring 60 to the corresponding intermediate layer 62.

In the exemplary embodiment of FIG. 4, the number N of conducting areas 50 is equal to 5.

In the following of the description, a guard ring designates a conducting portion surrounding a conducting layer, the guard ring not necessarily being in the shape of a circular ring. In the exemplary embodiments of FIGS. 4 to 8, the guard rings 60 are of a square shape with rounded angles, the conducting layers being square-shaped. Each guard ring 60 is obtained by metallization of a corresponding insulating stratum 31 of the insulating substrate. Each guard ring 60 is for example made in tungsten or in molybdenum.

A guard ring 60 is positioned in the plane of each conducting layer 36, 40, 62 except for a central intermediate layer 66 substantially positioned at half the distance between the first and second outer layers 36, 40. Each intermediate layer 62 has a peripheral edge 68, the guard ring 60 is substantially parallel to the peripheral edge 38, 42, 68 of the corresponding conducting layer. The spacing between the peripheral edge 38, 42, 68 of the corresponding conducting layer and the guard ring 60 is for example equal to a predetermined distance De.

Each guard ring 60 is electrically connected to an intermediate layer 62 having an electric potential different from that of the conducting layer 36, 40, 62 around which it is laid out.

Each connection link 64 includes for example a metallized via. In the exemplary embodiment of FIG. 4, each connection link 64 includes two metallized vias positioned in the sectional plane of FIG. 4 and diametrically opposite relatively to the vertical axis Z. Alternatively, the connection link 64 consists of a single via. Still alternatively, the connection link 64 includes four metallized vias equidistributed around the Z axis, i.e. having an angle of 90° between two successive vias.

Thus, each conducting area 50 gives the possibility of imposing an electric potential of constant value and distinct from that of the other areas 50, the value of the electric potential of a corresponding conducting area being determined by the value of the electric potential of the intermediate layer 62 of the conducting area in the vicinity of the middle axis Z by means of the formula (2) described earlier for the first embodiment.

The values of the electric potentials Vi of the conducting areas 50 decrease from the edge 38 of the first outer layer 36 towards the outside of the device 16 and towards the second outer layer 40.

The operation of this second embodiment is like the one of the first embodiment, the conducting areas 50 allowing the potential lines to be moved apart from each other as compared with an electric insulation device of the state of the art only including the outer conducting layers in the absence of any additional conducting area. The value of the electrostatic field in the vicinity of the peripheral edges 38, 42, 68 is then reduced for a same thickness Ep of an insulating substrate 30 and for same values of the first and second electric potentials V1, V2.

The conducting areas 50 give the possibility of imposing an electric potential value distinct from the first and second electric potentials V1, V2, including in the plane of the first and second outer layers 36, 40, because of the guard rings 60. The value of the electrostatic field in the vicinity of the peripheral edges 38, 42 is therefore more reduced with the insulation device according to the second embodiment than with the insulation device according to the first embodiment, as shown in FIG. 5 depicting electrostatic field lines 69, wherein the areas in the vicinity of the peripheral edges 38, 42, 54 are less dark than the corresponding areas of FIG. 3. One skilled in the art will also notice that these areas are of more reduced dimensions than the corresponding zones of FIG. 3.

Figure 6:
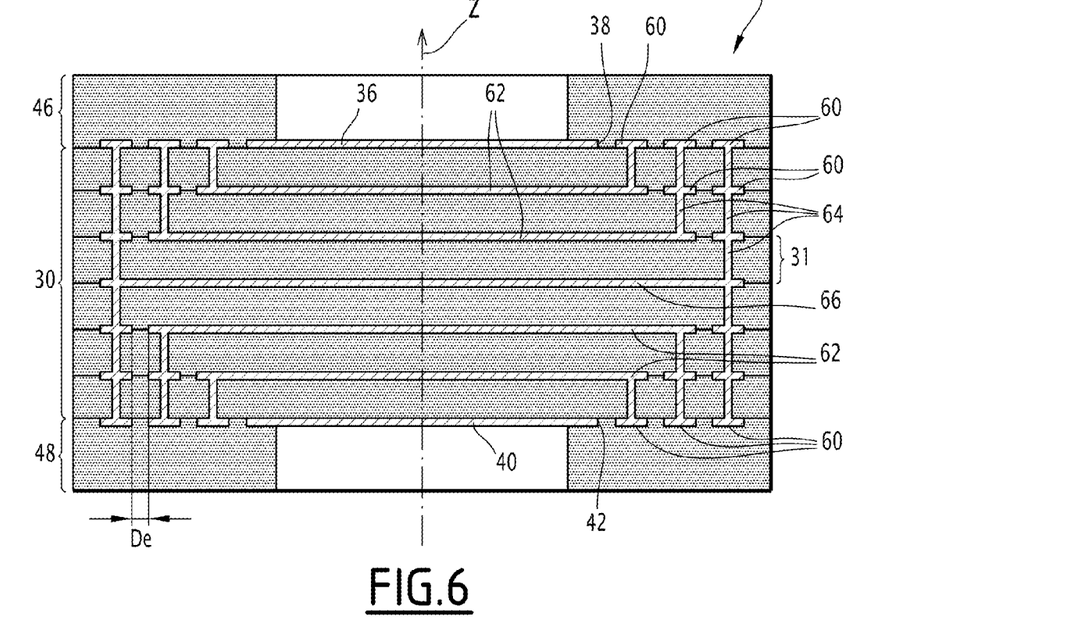
FIG. 6 is a view like the one of FIG. 2 according to a third embodiment of the invention.

FIG. 6 illustrates a third embodiment of the invention for which the elements like those of the second embodiment described earlier are marked with identical references and are therefore not described again.

According to the third embodiment, each conducting area 50 includes at least one guard ring 60 and an electrically conducting intermediate layer 62 positioned in the insulating substrate 30 parallel to the first outer layer 36. Each conducting area 50 also includes a link 64 for connecting said or each guard ring 60 to the corresponding intermediate layer 62.

In the exemplary embodiment of FIG. 6, the number N of conducting areas 50 is equal to 5.

A guard ring 60 is positioned in the plane of each conducting layer 36, 40, 62 except for a central intermediate layer 66 substantially positioned at half the distance between the first and the second outer layer 36, 40. Each intermediate layer 62 has a peripheral edge 68, and the spacing between the peripheral edge 38, 42, 68 of the corresponding conducting layer and the guard ring 60 is for example equal to a predetermined distance De.

A plurality P of guard rings 60 are positioned in the plane of the outer layers 36, 40, the P guard rings being spaced apart from each other and from the peripheral edge 38, 42 of the corresponding outer layer 36, 40. The P guard rings 60 concentrically surround the corresponding outer layer 36, 40, while being substantially parallel to each other, as well as relatively to the peripheral edge 38, 42 of the corresponding outer layer 36, 40. The number P of guard rings 60 decreases from the plane of the outer layers 36, 40 to the plane of the central intermediate layer 66 which does not include any guard ring.

In the exemplary embodiment of FIG. 6, P is equal to 3. The planes of the two closest intermediate layers 62 to the outer layers 36, 40 include two guard rings 60, the planes of the following intermediate layers 62 including a guard ring 60, and the plane of the central intermediate layer 66 not including any guard ring.

Each guard ring 60 is electrically connected to an intermediate layer 62 having an electric potential different from the one of the conducting layer 36, 40, 62 around which it is laid out, and via another guard ring 60 when the intermediate layer 62 to which the guard ring 60 is connected, is not in the vicinity of the plane of the guard ring.

Each connection link 64 connecting a guard ring 60 to an intermediate layer 62, or else two guard rings 60 belonging to different planes, includes for example a metallized via. In the exemplary embodiment of FIG. 6, each connection link 64 includes two metallized vias positioned in the sectional plane of FIG. 4 and diametrically opposite relatively to the vertical axis Z. Alternatively, the connection link 64 consists of a single via. Still alternatively, the connection link 64 includes four metallized vias equidistributed around the axis Z.

The values of the electric potentials Vi of the conducting areas 50 decrease from the edge 38 of the first outer layer 36 towards the outside of the device 16 and towards the second outer layer 40.

The operation of this third embodiment is like the one of the second embodiment, and is therefore not described again.

The conducting areas 50 each including a guard ring 60 in the plane of one of the outer layers 36, 40 give the possibility of imposing electric potential values distinct from the first and second electric potentials V1, V2 also in the plane of the first and second outer layers 36, 40 which allows the lines to be moved still further apart than in the case of the second embodiment.

The value of the electrostatic field in the vicinity of the peripheral edges 38, 42 and of the guard rings 60 is therefore further reduced with the insulation device according to the third embodiment than with the insulation device according to the first and second embodiments.

Figure 7:
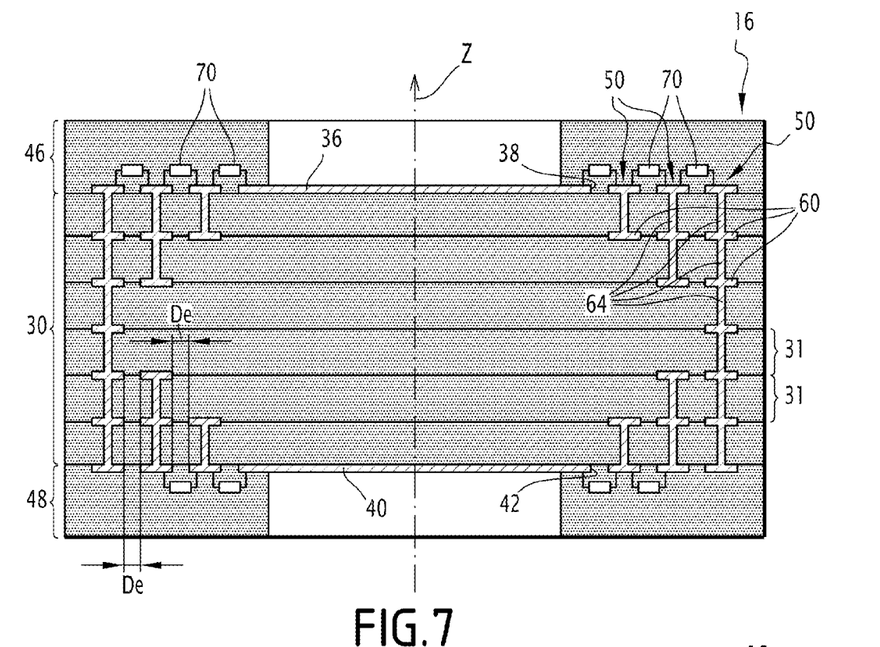
FIG. 7 is a view like the one of FIG. 2 according to a fourth embodiment of the invention.

FIG. 7 illustrates a fourth embodiment of the invention for which the elements like those in the third embodiment described earlier are marked with identical references and are therefore not described again.

According to the fourth embodiment, each conducting area 50 includes at least one guard ring 60, and does not include any intermediate layer positioned in the insulating substrate 30. The insulation device 16 includes, for each guard ring 60, an electric resistor 70 for connection with the neighboring guard ring 60 of greater electric potential or else with the corresponding outer layer 36, 40. The electric resistors are then able to impose distinct electric potential values from one guard ring 60 to the other, or else from the outer layer 36, 40 to the neighboring guard ring.

In the exemplary embodiment of FIG. 7, the number N of conducting areas 50 is equal to 5.

A plurality P of guard rings 60 are positioned in the planes of the outer layers 36, 40, the P guard rings being spaced apart from each other and from the peripheral edge 38, 42 of the corresponding outer layer 36, 40. The P guard rings 60 concentrically surround the corresponding outer layer 36, 40, while being substantially parallel to each other, as well as relatively to the peripheral edge 38, 42 of the corresponding outer layer 36, 40. The number P of guard rings 60 decreases from the plane of the outer layers 36, 40 right up to a substantially middle plane of the substrate 30 including a single guard ring, the middle plane being perpendicular to the Z axis.

In the exemplary embodiment of FIG. 7, P is equal to 3 and the number of distinct electric potentials in the planes of the outer layers 36, 40 is therefore equal to 4.

Each guard ring 60 is electrically connected to one or several other guard rings 60 laid out in distinct planes perpendicular to the Z axis. Each guard ring 60 is obtained by metallization of a corresponding insulating stratum 31 of the insulating substrate, each plane for laying out a guard ring 60 corresponding to the limit between two strata 31.

Each connection link 64 connecting two guard rings 60 belonging to different planes for example includes a metallized via. In the exemplary embodiment of FIG. 7, each connection link 64 includes two metallized vias positioned in the section plane of FIG. 4 and diametrically opposite relatively to the vertical axis Z. Alternatively, the connection link 64 consists of a single via. Still alternatively, the connection link 64 includes four metallized vias equidistributed around the axis Z.

The values of the electric potentials Vi of the conducting areas 50 decrease from the edge 38 of the first outer layer 36 towards the outside of the device 16 and towards the second outer layer 40.

The operation of this fourth embodiment is like the one of the third embodiment, and is therefore not described again.

The advantages of this fourth embodiment are like those of the third embodiment, and are therefore not described again.

Figure 8:
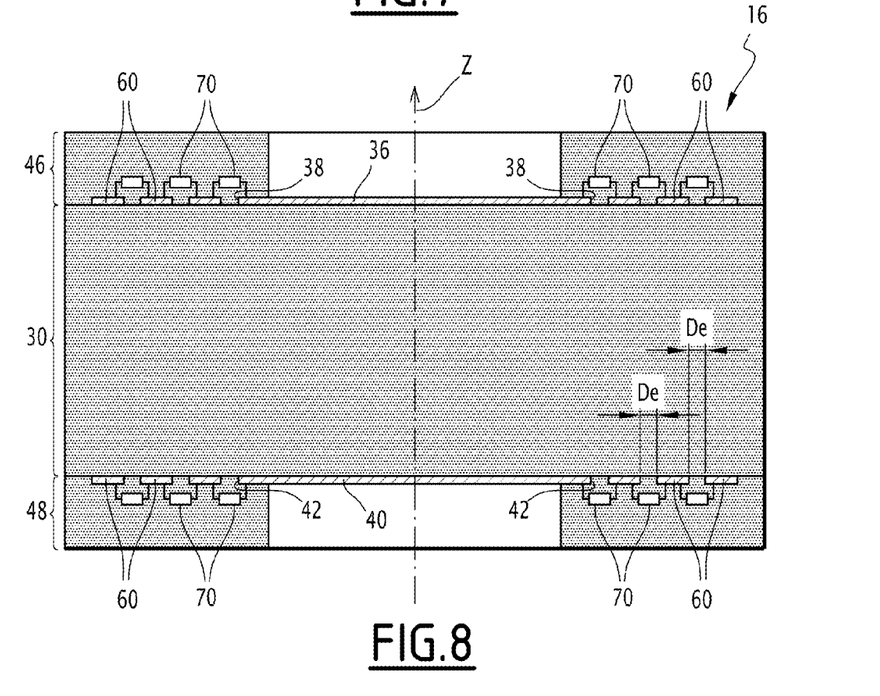
FIG. 8 is a view like the one of FIG. 2 according to a fifth embodiment of the invention.

FIG. 8 illustrates a fifth embodiment of the invention for which the elements like those of the fourth embodiment described earlier, are marked with identical references and are therefore not described again.

According to the fifth embodiment, each conducting area 50 includes a single guard ring 60 positioned in the plane of the corresponding one of the outer layers 36, 40 and does not include any intermediate layer or guard ring positioned in the insulating substrate 30. The insulation device 16 includes for each guard ring 60, an electric resistor 70 for connection with the neighboring guard ring 60 of greater electric potential or else with the corresponding outer layer 36, 40. The electric resistors are then able to impose distinct electric potential values from one guard ring 60 to the other, or else from the outer layer 36, 40 to the neighboring guard ring.

The reducer 44 includes N conducting areas 50, and the P guard rings 60 are positioned in the planes of the outer layers 36, 40, the P guard rings being spaced apart from each other and from the peripheral edge 38, 42 of the corresponding outer layer 36, 40. The guard rings 60 concentrically surround the corresponding outer layer 36, 40, while being substantially parallel to each other, as well as relatively to the peripheral edge 38, 42 of the corresponding outer layer 36, 40.

In the exemplary embodiment of FIG. 8, the reducer 44 includes N/2 guard rings 60 in the plane of each outer layer 36, 40. In other words, P is equal to N/2, i.e. 3 for example, N being equal to 6, and the number of distinct electric potentials in the planes of the outer layers 36, 40 is therefore equal to 4.

The values of the electric potentials Vi of the conducting areas 50 decrease from the edge 38 of the first outer layer 36 towards the outside of the device 16.

The operation of this fifth embodiment is like the one of the fourth embodiment, and is therefore not described again.

The advantages of this fifth embodiment are like the one of the fourth embodiment, and are therefore not described again.

It is thus conceivable that the electric insulation device according to the invention has a larger breakdown voltage while retaining a same substrate thickness, than an insulation device of the state of the art, in order not to increase the heat resistance of the substrate.

What is claimed is:

1. A device for electric insulation of an electrically conducting plane having a first electrical potential relative to a second electric potential, the device comprising:

an insulating substrate including first and second planar surfaces parallel to each other, a first electrically conducting, substantially planar, outer layer positioned on the first planar surface of the insulating substrate, the first outer layer forming the electrically conducting plane able to be connected to the first potential and having a peripheral edge, the second surface being able to be connected to the second electric potential, and an electrostatic field reducer for reducing the value of the electrostatic field in a point of the peripheral edge of the outer layer, the reducer including at least one electrically conducting area distinct from the first outer layer, positioned in the insulating substrate, the reducer being able to reduce the value of the electrostatic field in this point relative to the value of the electrostatic field in this point in the absence of the conducting area, the conducting area having an electric potential between the values of the first and second electric potentials, the reducer including N conducting areas, N being an integer, each of the conducting areas having a distinct electric potential between the values of the first and second electric potentials, each of the conducting areas including an electrically conducting intermediate layer positioned in the insulating substrate parallel to the first outer layer, each of the electrically conducting intermediate layers including a peripheral edge, each of the conducting areas further including a guard ring, each of the guard rings being positioned in a plane of and surrounding a different one of the first outer conducting layer and the intermediate conducting layers except for a central intermediate layer of the intermediate conducting layers, the spacing between each of the guard rings and the peripheral edge of the first or intermediate conducting layer the guard ring surrounds being equal to a predetermined distance, each of the guard rings being electrically connected to one of the intermediate conducting layers having a different potential than the first or intermediate conducting layer the guard ring surrounds.

2. The device according to claim 1, wherein the first outer layer forms a track for circulating an electric current and forms the only track for circulating an electric current of the device.

3. The device according to claim 1, further comprising a second electrically conducting, substantially planar, outer layer, positioned on the second planar surface of the insulating substrate, the conducting areas being distinct from the first and second outer layers and positioned in the insulating substrate.

4. The device according to claim 3, wherein N is greater than or equal to 2 the values of the electric potentials of the conducting areas decrease from the edge of the first outer layer towards the second outer layer.

5. The device according to claim 1, wherein each of the intermediate layers extends at least up to an equivalent in the plane of the respective intermediate layer, of the peripheral edge of the first outer layer, translated along a direction normal to the plane of the first outer layer.

6. The device according to claim 1, wherein each of the conducting areas includes means for setting the value of the electric potential of the guard ring to a value between the values of the first and second electric potentials, the spacing between the respective peripheral edge of the outer layer and the respective guard ring being equal to a predetermined distance.

7. The device according to claim 6, wherein the guards rings comprises P guard rings concentrically surrounding each outer layer and are positioned in the plane of each outer layer, P being greater than or equal to 2, the P guard rings being spaced apart from each other and from the peripheral edge of the corresponding outer layer.

8. The device according to claim 6, wherein an attachment means include for each guard ring, an electrically conducting intermediate layer positioned in the insulating substrate parallel to the first outer layer, and an electric link between the respective guard ring and the respective intermediate layer.

9. The device according to claim 1, further comprising a border for covering the peripheral edge of the first outer layer, the covering border being electrically insulating.

10. An electric power supply system for electronic components, the system comprising:
a power supply source delivering an electric voltage to a conducting plane, the conducting plane having a first electric potential and being connected to the electronic components; and
a device for electric insulation of the conducting plane relative to a second electric potential, the insulation device being the insulation device according to claim 1, the first outer layer having the first electric potential and forming the conducting plane, and the second surface being connected to the second electric potential.

11. A method for using a distinct electrically conducting area relative to a first electrically conducting outer layer of a device for electric insulation of an electrically conducting plane having a first electric potential relative to a second electric potential, comprising the step of:
reducing the value of the electrostatic field in a point of a peripheral edge of the first outer layer relative to the value of the electrostatic field in this point in the absence of the conducting area, the device comprising an insulating substrate including two planar surfaces parallel to each other, the first substantially planar outer layer positioned on a first planar surface of the insulating substrate, the first outer layer forming the electrically conducting plane able to be connected to the first potential and having a peripheral edge, and the second surface being able to be connected to the second electric potential, the conducting area being positioned in the insulating substrate and the conducting area having an electric potential of value between the values of the first and second electric potentials
wherein the device comprises:
an insulating substrate including first and second planar surfaces parallel to each other, a first electrically conducting, substantially planar, outer layer positioned on the first planar surface of the insulating substrate, the first outer layer forming the electrically conducting plane able to be connected to the first potential and having a peripheral edge, the second surface being able to be connected to the second electric potential, and
an electrostatic field reducer for reducing the value of the electrostatic field in a point of the peripheral edge of the outer layer, the reducer including at least one electrically conducting area distinct from the first outer layer, positioned in the insulating substrate, the reducer being able to reduce the value of the electrostatic field in this point relative to the value of the electrostatic field in this point in the absence of the conducting area, the conducting area having an electric potential between the values of the first and second electric potential, the reducer including N conducting areas, N being an integer, each of the conducting areas having a distinct electric potential between the values of the first and second electric potentials, each of the conducting areas including an electrically conducting intermediate layer positioned in the insulating substrate parallel to the first outer layer, each of the electrically conducting intermediate layers including a peripheral edge, each of the conducting areas further including a guard ring, each of the guard rings being positioned in a plane of and surrounding a different one of the first outer conducting layer and the intermediate conducting layers except for a central intermediate layer of the intermediate conducting layers, the spacing between each of the guard rings and the peripheral edge of the first or intermediate conducting layer the guard ring surrounds being equal to a predetermined distance, each of the guard rings being electrically connected to one of the intermediate conducting layers having a different potential than the first or intermediate conducting layer the guard ring surrounds.

* * * * *